United States Patent
Chang et al.

(10) Patent No.: US 9,761,468 B2
(45) Date of Patent: Sep. 12, 2017

(54) DEVICE AND METHOD FOR WAFER TAPING

(71) Applicant: Taiwan Semiconductor Manufacturing Co., Ltd., Hsin-Chu (TW)

(72) Inventors: Yuh-Sen Chang, Chupei (TW); Shang-Hsien Lin, Hsinchu (TW); Chih-Yang Chan, Taiping (TW); Szu-Hsien Lee, Tainan (TW); Chia-Haw Yeh, Kaohsiung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 290 days.

(21) Appl. No.: 14/182,021

(22) Filed: Feb. 17, 2014

(65) Prior Publication Data
US 2015/0235879 A1    Aug. 20, 2015

(51) Int. Cl.
*H01L 21/67* (2006.01)
*H01L 21/31* (2006.01)

(52) U.S. Cl.
CPC .. *H01L 21/67132* (2013.01); *H01L 21/67092* (2013.01); *Y10T 156/108* (2015.01); *Y10T 156/1343* (2015.01); *Y10T 156/1705* (2015.01)

(58) Field of Classification Search
CPC ............... H01L 21/31; H01L 21/67092; H01L 21/67132; Y10T 156/108; Y10T 156/1343; Y10T 156/1705
See application file for complete search history.

(56) References Cited

U.S. PATENT DOCUMENTS

| | | | | |
|---|---|---|---|---|
| 6,106,246 A | * | 8/2000 | Steck | F04B 7/04 417/395 |
| 2007/0181245 A1 | * | 8/2007 | Kaneshima | B29C 63/02 156/229 |
| 2008/0184855 A1 | * | 8/2008 | Yamamoto | B26D 7/14 83/27 |
| 2012/0087774 A1 | * | 4/2012 | Vekstein | H01L 21/67132 414/816 |

* cited by examiner

*Primary Examiner* — Mark A Osele
*Assistant Examiner* — Christopher C Caillouet
(74) *Attorney, Agent, or Firm* — McClure, Qualey & Rodack, LLP

(57) ABSTRACT

In accordance with some embodiments, a wafer taping device is provided. The wafer taping device includes a tape delivering along a first direction. The wafer taping device also includes a wafer mount unit disposed below the tape. The wafer mount unit has an upper surface for supporting a wafer and having a notch for allowing a cut mark of the wafer to align with it. The notch is staggered with a second direction in the upper surface, and the second direction is substantially perpendicular to the first direction. In addition, the wafer taping device includes a laminating roller disposed above the wafer mount unit and having a long axis elongated in the second direction. The laminating roller is configured to reciprocate along the first direction for pressing the tape to the wafer.

20 Claims, 5 Drawing Sheets

DEVICE AND METHOD FOR WAFER TAPING

BACKGROUND

The semiconductor integrated circuit (IC) industry has been experiencing rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

Semiconductor devices are generally manufactured using two complex manufacturing processes, i.e., front-end manufacturing, and back-end manufacturing, each involving potentially hundreds of steps. Front-end manufacturing involves the formation of a plurality of dies on the surface of a semiconductor wafer. Back-end manufacturing involves singulating an individual die from the finished wafer and packaging the die to provide structural support and environmental isolation. Taping processes can be applied to the semiconductor wafer during the front-end and back-end processes to protect a surface of the semiconductor wafer and provide mechanic support and other functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
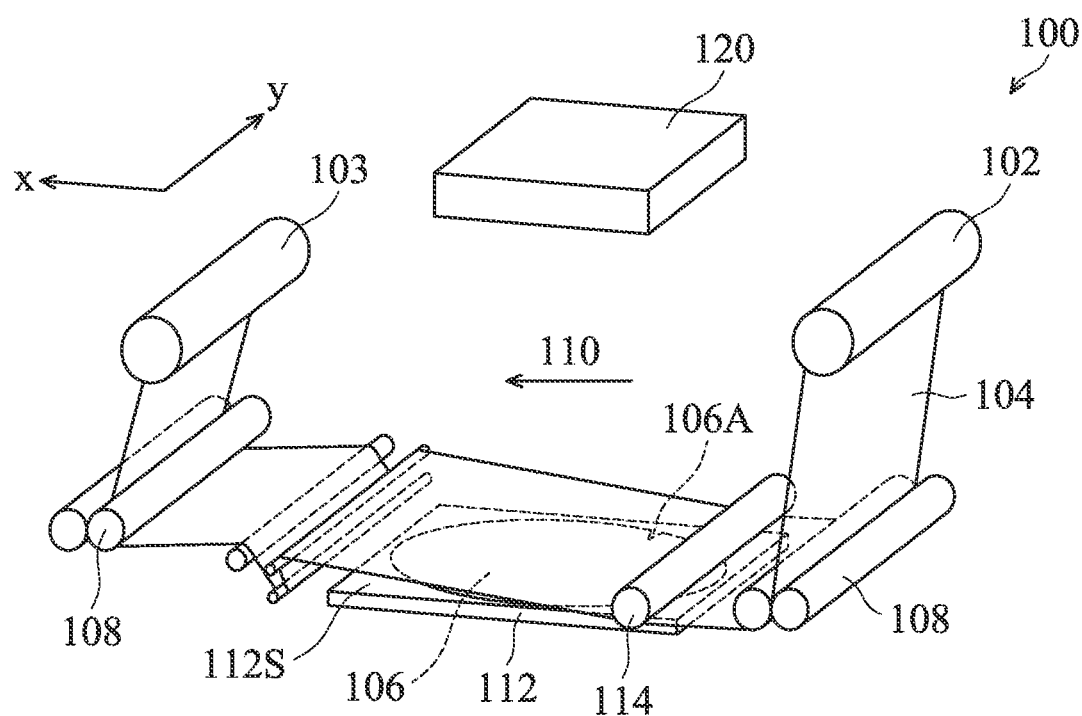
FIG. 1 shows a perspective view of a wafer taping device, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a perspective view of a wafer taping device 100, in accordance with some embodiments of the present disclosure. Referring to FIG. 1, a wafer taping device 100 includes a tape feeder 102 for drawing out a tape 104 to adhere to a wafer 106 and a winding roller 103 for winding a release of the tape 104 drawn out from the tape feeder 102. Nip rollers 108 are arranged between the tape feeder 102 and the winding roller 103 for guiding a delivering path 110 of the tape 104. In some embodiments, the tape delivering path 110 is along a first direction (e.g., the x-direction as shown in FIG. 1). In some embodiments, each of the nip rollers 108 includes two or more sub-rollers which nip the tape 104 to guide the delivering path 110 and control the delivering speed. Examples of the tape 104 include a dry film photoresist, a tape ball grid (TAB) tape and a blue tape. Alternatively, the tape 104 can be any suitable tape to meet the needs of various processes, such as a ball grid array assembly process, a wafer backside grinding process or other suitable processes.

The wafer 106 may be a semiconductor wafer having a semiconductor substrate, which includes a plurality of electrical features (not shown) formed on its front surface. In some embodiments, the wafer 106 has a diameter greater than about 100 nm. In some embodiments, the wafer 106 has a diameter greater than about 450 nm. In some embodiments, the wafer 106 has a cut mark 106A (such as a V-shaped notch) that is usable to identify the orientation of the wafer 106.

A wafer mount unit 112 is disposed below the tape delivering path 110, in accordance with some embodiments. In some embodiments, the wafer 106 is mounted on an upper surface 112S of the wafer mount unit 112. The wafer mount unit 112 may include a vacuum device generating a suction force that pulls the wafer 106 toward the upper surface 112S of the wafer mount unit 112. Alternatively, the wafer mount unit 112 may include an electrostatic device generating an electrostatic force that pulls the wafer 106 toward the upper surface 112S of the wafer mount unit 112. In some embodiments, the wafer 106 is secured on the upper surface 112S of the wafer mount unit 112 by the vacuum device and/or the electrostatic device.

Figure 2A:
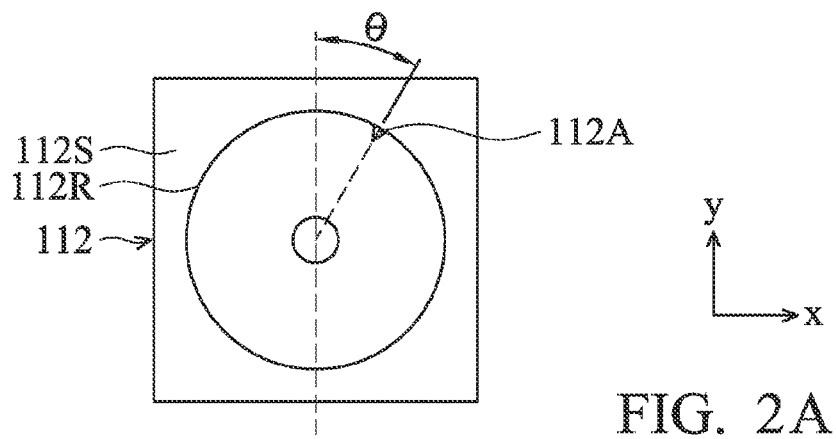
FIGS. 2A-2C show top views of wafer mount units, in accordance with some embodiments.
Figure 2B:
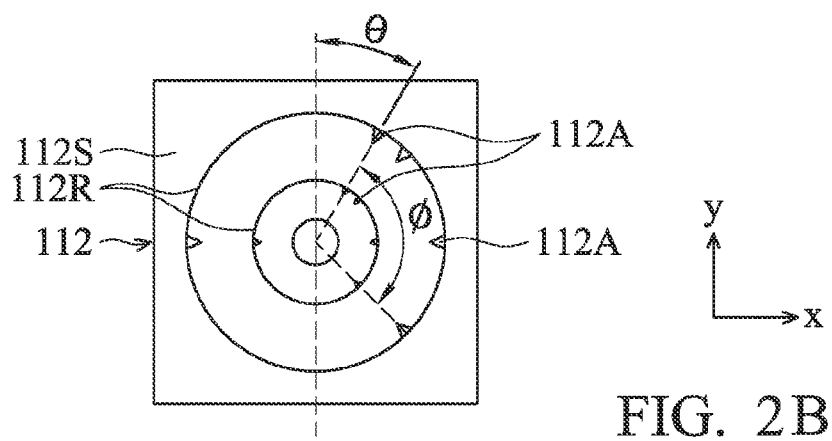
Figure 2C:
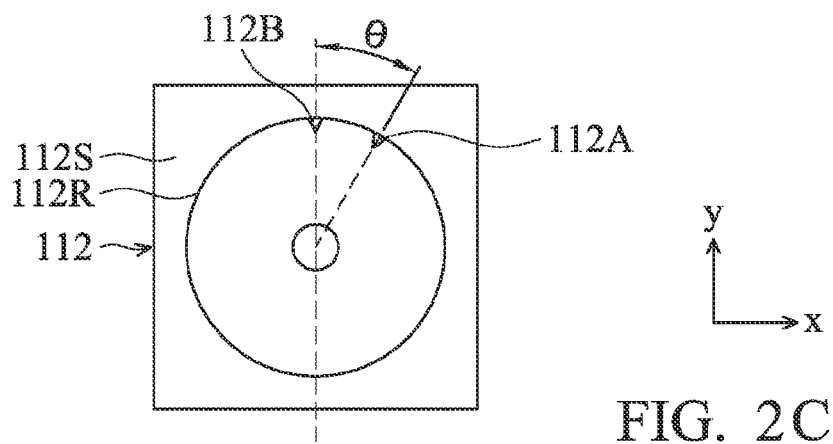

FIGS. 2A-2C show top views of wafer mount units 112, in accordance with some embodiments. For example, as shown in FIG. 2A, the wafer mount unit 112 has a mark ring 112R and a notch 112A on its upper surface 112S, in accordance with some embodiments. The mark ring 112R is configured to identify the position of the wafer 106 by matching the perimeter of the wafer 106 to the mark ring 112R. In some embodiments, the notch 112A has a shape (e.g., the V-shape) corresponding to that of the cut mark 106A of the wafer 106. The notch 112A is configured to identify the orientation of the wafer 106. The cut mark 106A of the wafer 106 may be aligned with the notch 112A of the wafer mount unit 112 for confirming if the wafer 106 in a correct orientation. In some embodiments, the notch 112A of the wafer mount unit 112 is staggered with a second direction (e.g., the y-direction as shown in FIG. 2A) in the upper surface 112S of the wafer mount unit 112. The second direction is substantially perpendicular to the first direction (e.g., the X-direction as shown in FIG. 2A). In some embodiments, the notch 112A and the second direction have an included angle θ ranging from about 5 degrees to about 90 degrees with the second direction in the upper surface 112S. In some embodiments, the included angle θ is about 30 degrees. In some embodiments, the included angle θ is about 90 degrees. In some embodiments, the included angle is about 45 degrees.

In some embodiments, as shown in FIG. 2B, the wafer mount unit 112 has more than one mark ring 112R. In addition, the wafer mount unit 112 may have more than one notch 112A on its upper surface 112S with different included angles with the second direction. In some embodiments, each of the notches 112A is staggered with the second direction and has the included angle θ with the second direction. In some embodiments, two of the notches 112A have an included angle φ ranging from about 5 degrees to about 90 degrees. In some embodiments, the included angle φ is about 45 degrees. In some embodiments, the included angle φ is about 90 degrees. In some embodiments, as shown in FIG. 2C, the wafer mount unit 112 has more than one notch 112A, but includes one of the notches 112B positioned in the second direction and the other notches 112A are staggered with the second direction with the included angle θ.

Referring back to FIG. 1, a laminating roller 114 is arranged over the wafer mount unit 112 and the tape 104. In some embodiments, the laminating roller 114 is a cylinder elongated along the second direction (e.g., the y-direction as shown in FIG. 1). The laminating roller 114 is configured to reciprocate over the wafer 106 and press the tape 104 to the wafer 106. The laminating roller 114 may help the tape 104 sufficiently adhered to the wafer 106 and extrude bubbles. In some embodiments, the bubbles are formed between the tape 104 and the electrical features of the wafer 106 during a roller taping process.

In some embodiments, the performance of bubble extrusion by the laminating roller 114 is affected by the topography of electrical features on the wafer 106 and a moving direction of the laminating roller 114. The electrical features on the wafer 106 are usually formed along scribe lines which are formed of a chessboard like pattern. Many grooves that can be provided for pushing the bubbles out are arranged along the scribe lines. Accordingly, some of the grooves are arranged in the second direction when the cut mark 106A of the wafer 106 is aligned with the notch 112A of the wafer mount unit 112. In this condition, there is some possibility that the performance of the bubble extrusion by the laminating roller 114 is limited since the grooves and the elongated direction of the laminating roller 114 are parallel to each other.

Figure 3A:
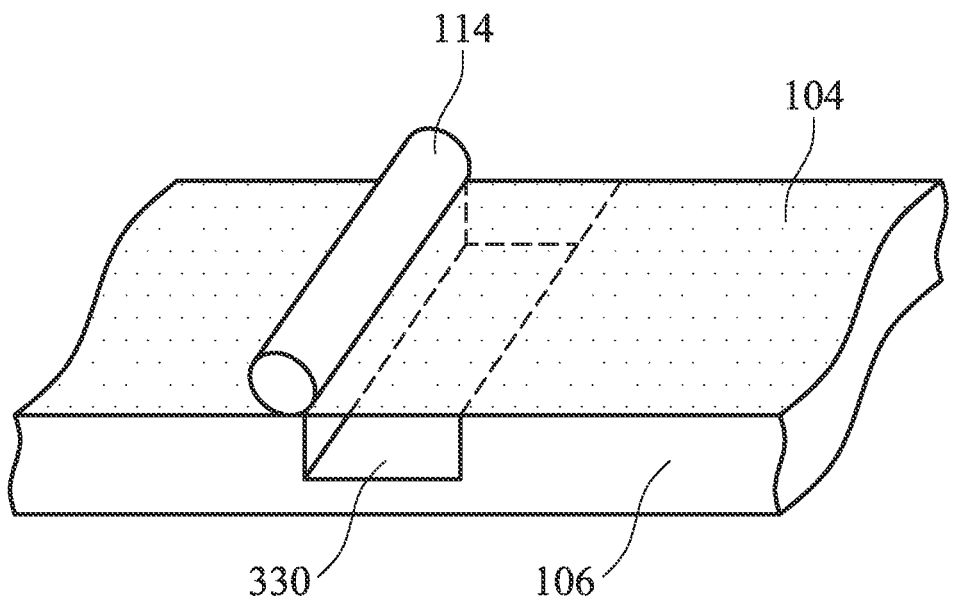
FIGS. 3A and 3B show perspective views of a portion of wafers and laminating rollers, in accordance with some embodiments.

For example, see FIG. 3A. It shows a perspective view of a portion of the wafer 106 and the laminating roller 114 when the cut mark 106A of the wafer 106 is aligned with the notch 112A of the wafer mount unit 112 in the second direction, in accordance with some embodiments. The air in the groove 330 would be not easily released since the groove 330 is parallel to the long axis of the laminating roller 114 and perpendicular to the moving direction of the laminating roller 114.

Figure 3B:
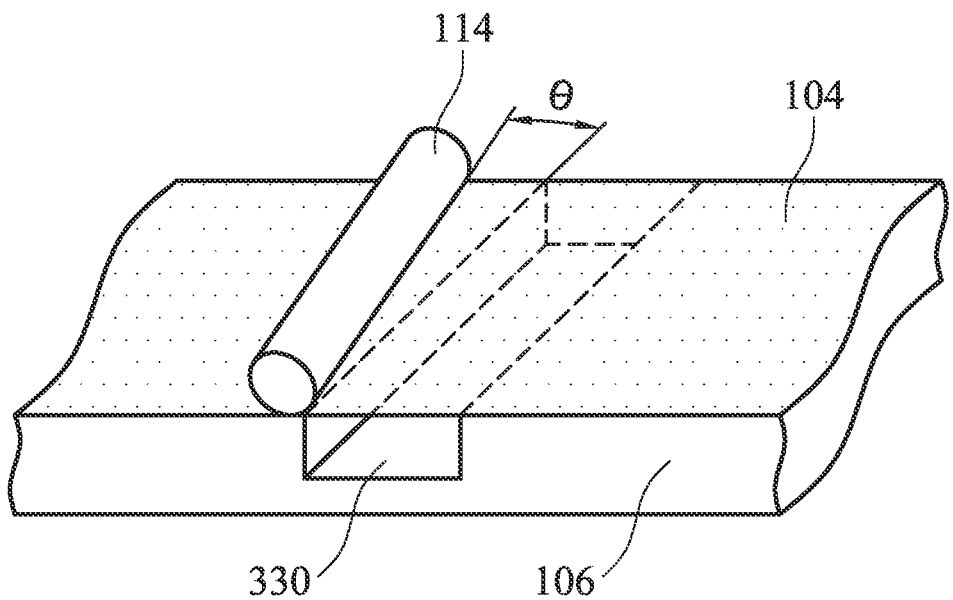

In some embodiments, see FIG. 3B. It shows a perspective view of a portion of the wafer 106 and the laminating roller 114 when the cut mark 106A of the wafer 106 is aligned with the notch 112A of the wafer mount unit 112 at a position staggered with the second direction, in accordance with some embodiments. The grooves 330 can have the included angle θ with the long axis of the laminating roller 114 and is not perpendicular to the moving direction of the laminating roller 114. The time and sweep area of the laminating roller 114 that actually functions to push out the bubble are increased. Accordingly, the air (i.e., bubble) would become easier to be released, as compared to the embodiments shown in FIG. 2A, and a higher moving speed of the laminating roller 114 can be tolerated.

In some embodiments, since there is more than one notch 112A on the wafer mount unit 112, and more than one of the orientations of the wafer 106 can be selected. The topography on the wafer 106 can be varied by choosing a different included angle with respect to the long axis of the laminating roller 114. In some embodiments, after the bubble extrusion is performed by the reciprocating of the laminating roller 114 when the wafer 106 is at a first orientation, the wafer 106 is rotated to a second orientation that aligns the cut mark 106A with another notch 112A. The reciprocating of the laminating roller 114 is then performed again to extrude the bubbles that are not easily extruded at the first orientation.

Referring back to FIG. 1, the wafer taping device 100 further includes a cutting tool 120, in accordance with some embodiments. The cutting tool 120 may be disposed over the tape 104 and the wafer mount unit 112 for cutting the tape 104 along the perimeter of the wafer 106. The cutting tool 120 may cut the tape 104 by using an optical operation, such as using a laser.

FIGS. 4A-4D shows perspective views at intermediate stages of a method for wafer taping, in accordance with some embodiments. In the following description, the method is also illustrated by referencing the wafer taping device 100.

Figure 4A:
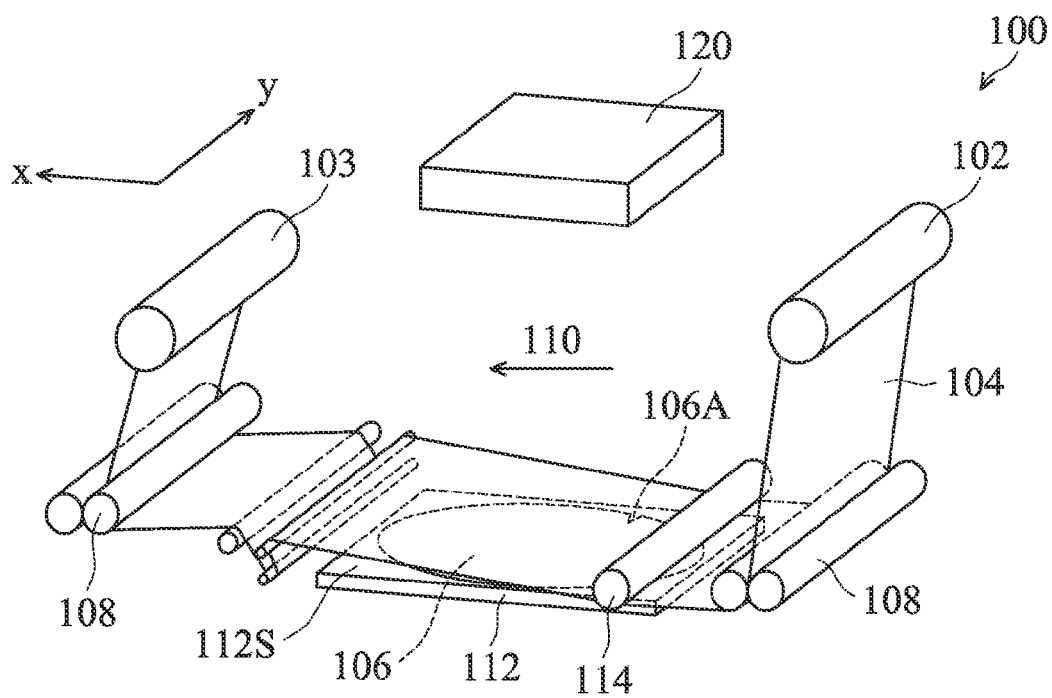
FIGS. 4A-4D show perspective views a wafer taping device at intermediate stages of a method for wafer taping, in accordance with some embodiments.

Referring to FIG. 4A, the wafer taping device 100 is provided, and the wafer 106 is mounted on the upper surface 112S of the wafer mount unit 112. In some embodiments, the cut mark 106A of the wafer 106 is aligned with the notch 112A of the wafer mount unit 112. The cut mark 106A has an included angle θ with the second direction (e.g., the second direction as shown in FIG. 3A), and the included angle θ is in a range from about 5 degrees to about 90 degrees.

Figure 4B:
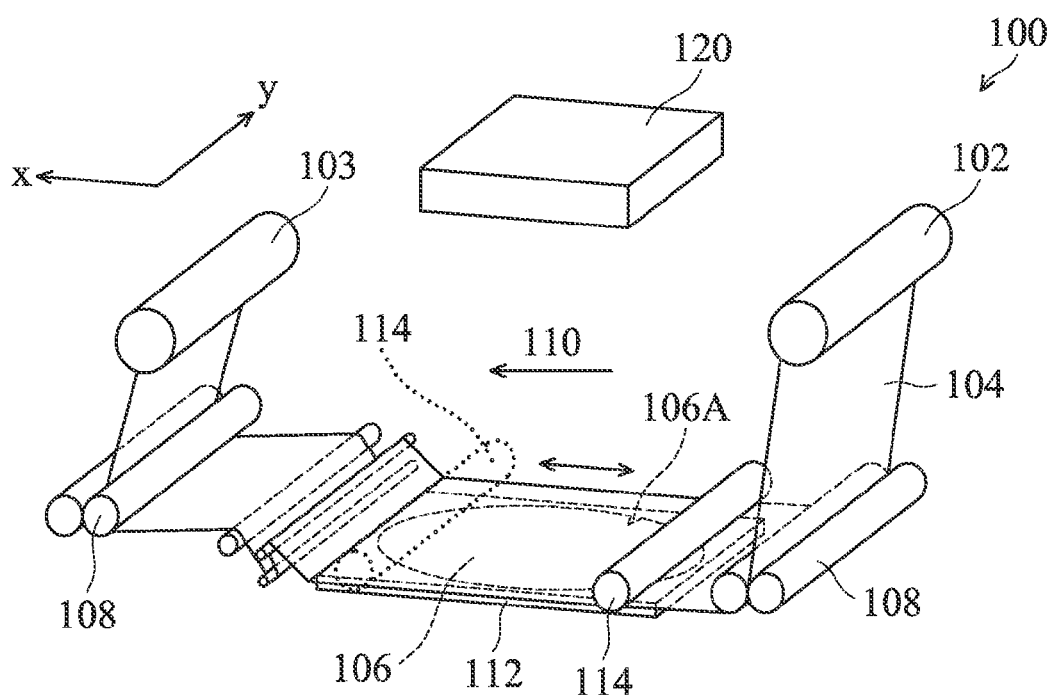

Afterwards, referring to FIG. 4B, the laminating roller 114 is reciprocated over the wafer 106 to enforce the tape 104 adhering to the wafer 106 and push out the bubbles between the tape 104 and the wafer 106.

Figure 4C:
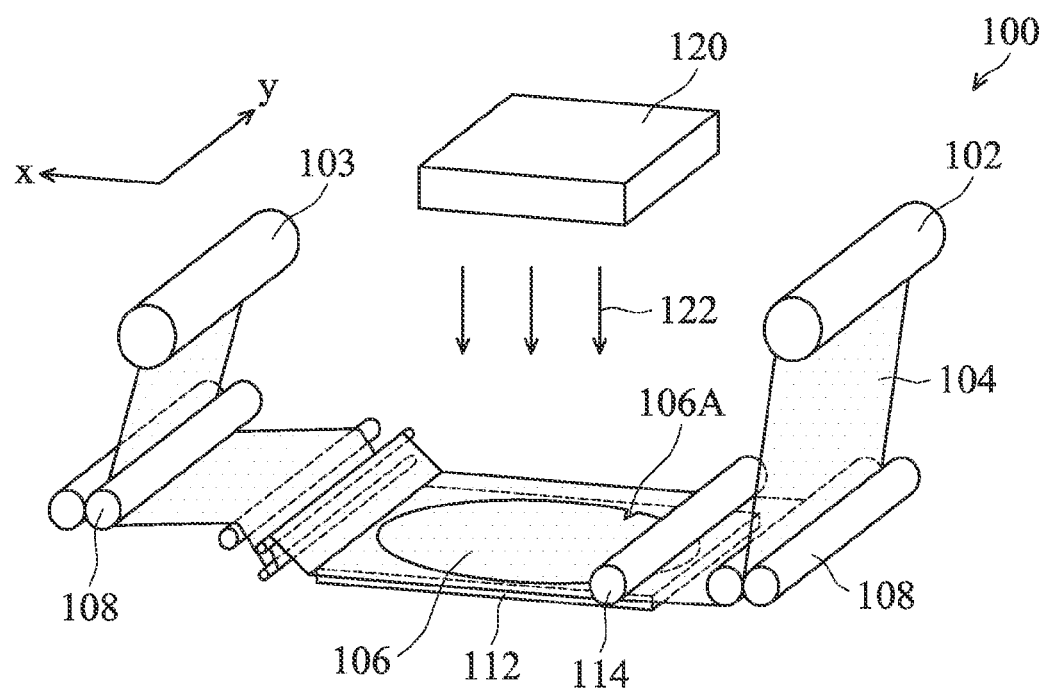

Afterwards, referring to FIG. 4C, the tape 104 is cut along the perimeter of the wafer 106 using the cutting tool 120. For example, the tape 104 may be cut using an optical operation 122, such as using a laser. In some embodiments, a cleaning process is then performed on the wafer edge to clean up the particles or residuals on the wafer 106.

Figure 4D:
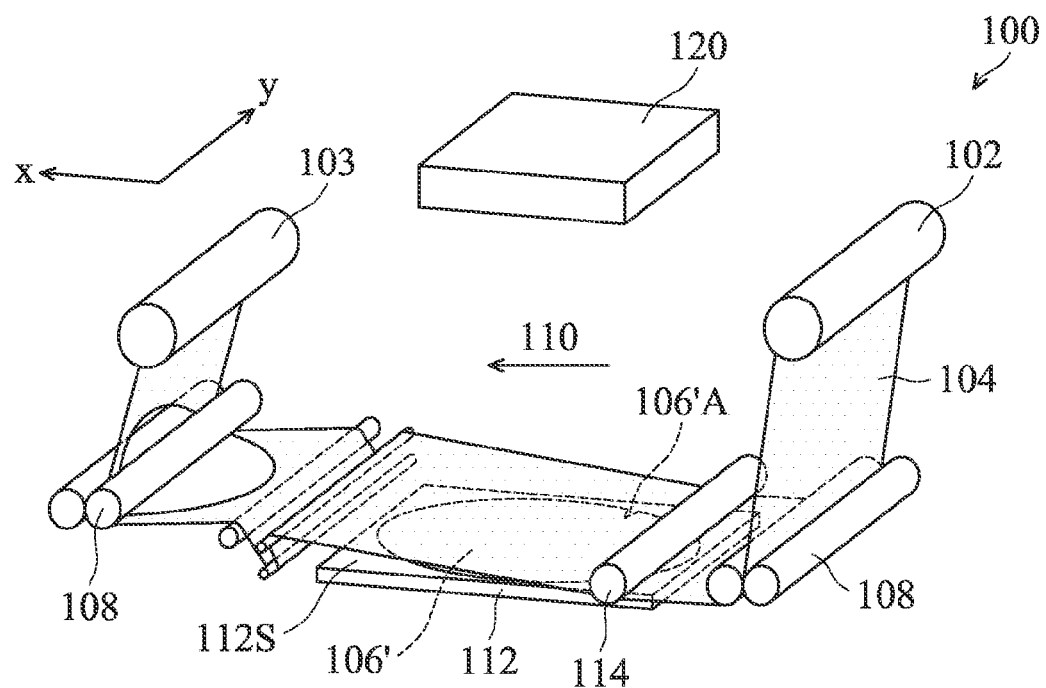

Afterwards, referring to FIG. 4D, the wafer 106 is transferred out of the wafer taping device 100 to perform other treatments, such as a develop process or a wafer backside grinding process. Meanwhile, the tape 104 is delivered forward along the delivering path 110. Another wafer 106' is then transferred onto the wafer mount unit 112, and the operations as shown in FIGS. 4B to 4D are repeated.

In accordance with some embodiments, a wafer tape device is provided. The wafer tape device includes a wafer mount unit having a notch for allowing a cut mark of the wafer to align with it. The notch of the wafer mount unit is staggered with the long axis of a laminating roller and not perpendicular to the moving direction of the laminating roller. Accordingly, the time and sweep area of the laminating roller that actually functions to push out the bubble are increased, and the performance of bubble extrusion is improved.

In accordance with some embodiments, a wafer taping device is provided. The wafer taping device includes a tape delivering along a first direction. The wafer taping device also includes a wafer mount unit disposed below the tape. The wafer mount unit has an upper surface for supporting a wafer and has a notch for allowing a cut mark of the wafer to align with it. The notch is staggered with a second direction in the upper surface, and the second direction is substantially perpendicular to the first direction. In addition, the wafer taping device includes a laminating roller disposed above the wafer mount unit and having a long axis elongated in the second direction. The laminating roller is configured to reciprocate along the first direction for pressing the tape to the wafer.

In accordance with some embodiments, a method of wafer taping is provided. The method includes providing a wafer taping device. The wafer taping device includes a tape delivering along a first direction. The wafer taping device also includes a wafer mount unit having an upper surface and a notch on the upper surface. The notch is staggered with a second direction in the upper surface, and the second direction is substantially perpendicular to the first direction. The wafer taping device further includes a laminating roller disposed over the wafer mount unit and the tape. The method also includes positioning a wafer to the upper surface of the wafer mount unit. The wafer has a cut mark, and the cut mark is aligned with the notch. The method further includes reciprocating the laminating roller for pressing the tape to the wafer. In addition, the method includes cutting the tape along a perimeter of the wafer.

In accordance with some embodiments, a wafer taping device is provided. The wafer taping device includes a tape feeder delivering a tape along a first direction. The wafer taping device also includes a winding roller winding a release of the tape drawn out from the tape feeder. The wafer taping device further includes a wafer mount unit disposed between the tape feeder and the winding roller. The wafer mount unit has an upper surface for supporting a wafer and having a plurality of notches for allowing a cut mark of the wafer to align with one of the notches. At least one of the plurality of notches is staggered with a second direction in the upper surface, and the second direction is substantially perpendicular to the first direction. In addition, the wafer taping device includes a laminating roller disposed above the wafer mount unit and being a cylinder that has a long axis elongated in the second direction. The laminating roller is configured to reciprocate along the first direction for pressing the tape to the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer taping device for delivering a tape along a first direction, the wafer taping device, comprising:
    a wafer mount unit disposed below the tape, wherein the wafer mount unit has an upper surface for supporting a wafer and has a notch for allowing a cut mark of the wafer to align with it, wherein the notch is staggered with a second direction in the upper surface, wherein the second direction is substantially perpendicular to the first direction, wherein the wafer mount unit has a first mark ring and a second mark ring; and
    a laminating roller disposed above the wafer mount unit and having a long axis elongated in the second direction, wherein the laminating roller is configured to reciprocate along the first direction for pressing the tape to the wafer.

2. The wafer taping device as claimed in claim 1, wherein the notch of the wafer mount unit has an included angle with the second direction, and the included angle is in a range from about 5 degrees to about 90 degrees.

3. The wafer taping device as claimed in claim 2, wherein the included angle is about 45 degrees.

4. The wafer taping device as claimed in claim 1, further comprising a tape feeder and a winding roller disposed on opposite sides of the wafer mount unit, wherein the tape feeder delivers the tape along the first direction, and the winding roller winds a release of the tape drawn out from the tape feeder.

5. The wafer taping device as claimed in claim 1, wherein the wafer mount unit comprises a vacuum device or an electrostatic device for pulling the wafer toward the upper surface of the wafer mount unit.

6. The wafer taping device as claimed in claim 1, further comprising a cutting tool configured to cut the tape.

7. The wafer taping device as claimed in claim 1, further comprising at least one nip roller for guiding a delivering path of the tape.

8. The wafer taping device as claimed in claim 1, wherein the tape comprises a dry film photoresist, a tape ball grid (TAB) tape or a blue tape.

9. The wafer taping device as claimed in claim 1, wherein the notch is arranged along the first mark ring, the wafer mount unit further has a second notch, and the second notch is arranged along the second mark ring.

10. The wafer taping device as claimed in claim 1, wherein the first mark ring surrounds the second mark ring.

11. A method of taping a wafer, comprising:
    providing a wafer taping device, comprising:
    a tape delivering along a first direction;
    a wafer mount unit having an upper surface and a notch on the upper surface, wherein the notch is staggered with a second direction in the upper surface, and the second direction is substantially perpendicular to the first direction, wherein the wafer mount unit further has another notch on the upper surface, wherein the notch and the another notch has different included angles with the second direction; and
    a laminating roller disposed over the wafer mount unit and the tape;
    positioning a wafer to the upper surface of the wafer mount unit, wherein the wafer has a cut mark, and the cut mark is aligned with the notch;
    reciprocating the laminating roller for pressing the tape to the wafer;

aligning the cut mark of the wafer with the another notch after reciprocating the laminating roller; and cutting the tape along a perimeter of the wafer.

12. The method of claim 11, wherein the notch of the wafer mount unit has an included angle with the second direction, and the included angle is in a range from about 5 degrees to about 90 degrees.

13. The method of claim 12, wherein the included angle is about 45 degrees.

14. The method of claim 11, further comprising reciprocating the laminating roller again after the cut mark of the wafer is aligned with the another notch.

15. The method of claim 11, wherein the tape is cut by a laser.

16. A wafer taping device, comprising:
a tape feeder delivering a tape along a first direction;
a winding roller winding a release of the tape drawn out from the tape feeder;
a wafer mount unit disposed between the tape feeder and the winding roller, wherein the wafer mount unit has an upper surface for supporting a wafer and having a plurality notches for allowing a cut mark of the wafer to align with one of the notches, wherein at least one of the plurality of notches is staggered with a second direction in the upper surface, wherein the second direction is substantially perpendicular to the first direction, wherein the wafer mount unit has a first mark ring and a second mark ring, and the first mark ring surrounds the second mark ring; and a laminating roller disposed above the wafer mount unit and being a cylinder that has a long axis elongated in the second direction, wherein the laminating roller is configured to reciprocate along the first direction for pressing the tape to the wafer.

17. The wafer taping device as claimed in claim 16, wherein each of the notches that is staggered with the second direction has an included angle with the second direction, and the included angle is in a range from about 5 degrees to about 90 degrees.

18. The wafer taping device as claimed in claim 16, wherein the plurality of notches comprises two notches that have an included angle ranging from about 5 degrees to about 90 degrees therebetween.

19. The wafer taping device as claimed in claim 16, wherein a first notch of the plurality of notches is arranged along the first mark ring, and a second notch of the plurality of notches is arranged along the second mark ring.

20. The wafer taping device as claimed in claim 19, wherein the first notch is larger than the second notch.

* * * * *